United States Patent [19]
Dennard et al.

[11] Patent Number: 6,020,581
[45] Date of Patent: Feb. 1, 2000

[54] SOLID STATE CMOS IMAGER USING SILICON-ON-INSULATOR OR BULK SILICON

[75] Inventors: Robert Heath Dennard, New Rochelle; Hon-sum Philip Wong, Chappaqua, both of N.Y.

[73] Assignee: International Business Machines Corporation, Armonk, N.Y.

[21] Appl. No.: 09/028,432

[22] Filed: Feb. 24, 1998

[51] Int. Cl.$^7$ ...................................................... H01J 40/14
[52] U.S. Cl. ........................................ 250/208.1; 348/308
[58] Field of Search ............................. 250/208.1, 214 R, 250/214.1; 257/197, 591–593, 440, 446, 448; 348/294, 300, 307, 308

[56] References Cited

U.S. PATENT DOCUMENTS

| | | | |
|---|---|---|---|
| 4,093,957 | 6/1978 | King et al. | 357/24 |
| 4,100,672 | 7/1978 | King et al. | 29/577 |
| 4,466,018 | 8/1984 | Soneda et al. | 348/300 |
| 4,597,012 | 6/1986 | Itoh et al. | 358/213 |
| 5,130,773 | 7/1992 | Tsukada | 357/23.7 |
| 5,463,420 | 10/1995 | Yamada | 348/294 |

FOREIGN PATENT DOCUMENTS

| | | |
|---|---|---|
| 1-072556 | 3/1989 | Japan . |
| 1-094627 | 4/1989 | Japan . |
| 1-136364 | 5/1989 | Japan . |
| 3-097271 | 4/1991 | Japan . |
| 4-233774 | 10/1993 | Japan . |
| 6-029510 | 2/1994 | Japan . |
| 6-237007 | 8/1994 | Japan . |

OTHER PUBLICATIONS

H. Kobayashi et al. "An analog CMOS network for Gaussian convolution with embedded image sensing," International Solid State Circuits Conference, p. 216, 1990. (Month unknown).

S. Mendis et al., "A 128×128 CMOS active pixel image sensor for highly integrated imaging system," International Electron Devices Meeting, p. 583, 1993. (Month unknown).

S. Mendis et al., "CMOS active pixel imager sensor," *IEEE Transactions on Electron Devices*, p. 452, 1994.. (Month unknown).

F. Andoh et al., "A 250,000–pixel image sensor with FET amplication at each pixel for high speed television cameras," International Solid State Circuits Conference, p. 212, 1990. (Month unknown).

H. Kawashima et al., "A ¼ inch format 250k pixel amplified MOS image sensor using CMOS process," International Electron Devices Meeting, p. 575, 1993. (Month unknown).

M. Sugawara et al., "An amplified MOS imager suited for image processing," International Solid State Circuits Conference, p. 228, 1994. (Month unknown).

W. Yang, "A wide–dynamic–range low–power photosensor array," International Solid State Circuits Conference, p. 230, 1994. (Month unknown).

B. Fowler et al., "A CMOS area image sensor with pixel–level A/D conversion," International Solid State Circuits Conference, p. 226, 1994. (Month unknown).

P.B. Denyer, "A hitchhiker's guide to the CMOS/CCD Olympic games," 1994 International CMOS Camera Workshop, Holmdel, New Jersey, 1994. (Month unknown).

O. Vellacott, "CMOS in a camera," *IEE Review*, vol. 40, p. 111, 1994. (Month unknown).

N. Ricquier et al., "Random addressable CMOS image sensor for industrial applications," *Sensors and Actuators A*, vol. 44, p. 29, 1994. (Month unknown).

A. Dickinson et al., "A 256×256 CMOS active–pixel image sensor with motion detection," International Solid State Circuits Conference, p. 226, 1995. (Month unknown).

S. Verdonckt–Vanderbroek et al., "High–gain lateral pnp bipolar action in a p–MOSFET structure," *IEEE Electron Device Letters*, vol. 13, p. 312, 1992. (Month unknown).

S. Verdonckt–Vanderborek et al., "High–gain lateral bipolar action in a MOSFET structure," *IEEE Transactions on Electron Devices*, vol. 38, p. 2487, 1991. (Month unknown).

J. Nocera et al., "A pixel selection scheme for MOS imager," *IBM Technical Disclosure Bulletin*, vol. 38, p. 255, 1995. (Month unknown).

H.–S. Wong, "Technology and Device Scaling Considerations for CMOS Imagers," *IEEE Transactions on Electron Devices*, vol. 43, p. 2131, 1996. (Month unknown).

*Primary Examiner*—Que T. Le
*Attorney, Agent, or Firm*—Robert M. Trepp

[57] ABSTRACT

An image sensor is described incorporating a plurality of detector cells arranged in an array where each detector cell has a MOSFET with a floating body and operable as a lateral bipolar transistor to amplify charge collected by the floating body. The invention overcomes the problem of insufficient charge being collected in detector cells formed on silicon-on-insulator (SOI) substrates due to silicon thickness and will also work in bulk silicon embodiments.

36 Claims, 6 Drawing Sheets

SOLID STATE CMOS IMAGER USING SILICON-ON-INSULATOR OR BULK SILICON

FIELD OF THE INVENTION

This invention relates to solid state imagers and more particularly to focal plane arrays for sensing radiant energy made on silicon-on-insulator (SOI) or bulk silicon with complementary metal oxide semiconductor (CMOS) circuits and processes.

BACKGROUND OF THE INVENTION

Solid state imagers using conventional CMOS technologies offer the potential of integrating many electronic functions on the same chip as the image sensor or focal plane array itself. Examples of CMOS imagers are described by A. Dickinson et al., "A 256×256 CMOS active-pixel image sensor with motion detection," International Solid State Circuits Conference, Digest of Technical Papers, ISSCC 1995 p 226–227; S. Mendis et al., "CMOS active pixel imager sensor," IEEE Trans. on Electron Devices, p 452, 1994 and B. Fowler et al., "A CMOS area image sensor with pixel-level A/D conversion," International Solid State Circuits Conference, Digest of Technical Papers, ISSCC 1994 p 226. The basic premise of the CMOS imager technology is that the imaging function can be performed using conventional technologies with minimal CMOS process modifications during fabrication. technologies using silicon-on-insulator (SOI) substrates have emerged as a promising technology. It is therefore desirable to construct image sensors which are compatible with CMOS on SOI.

Figure 1:
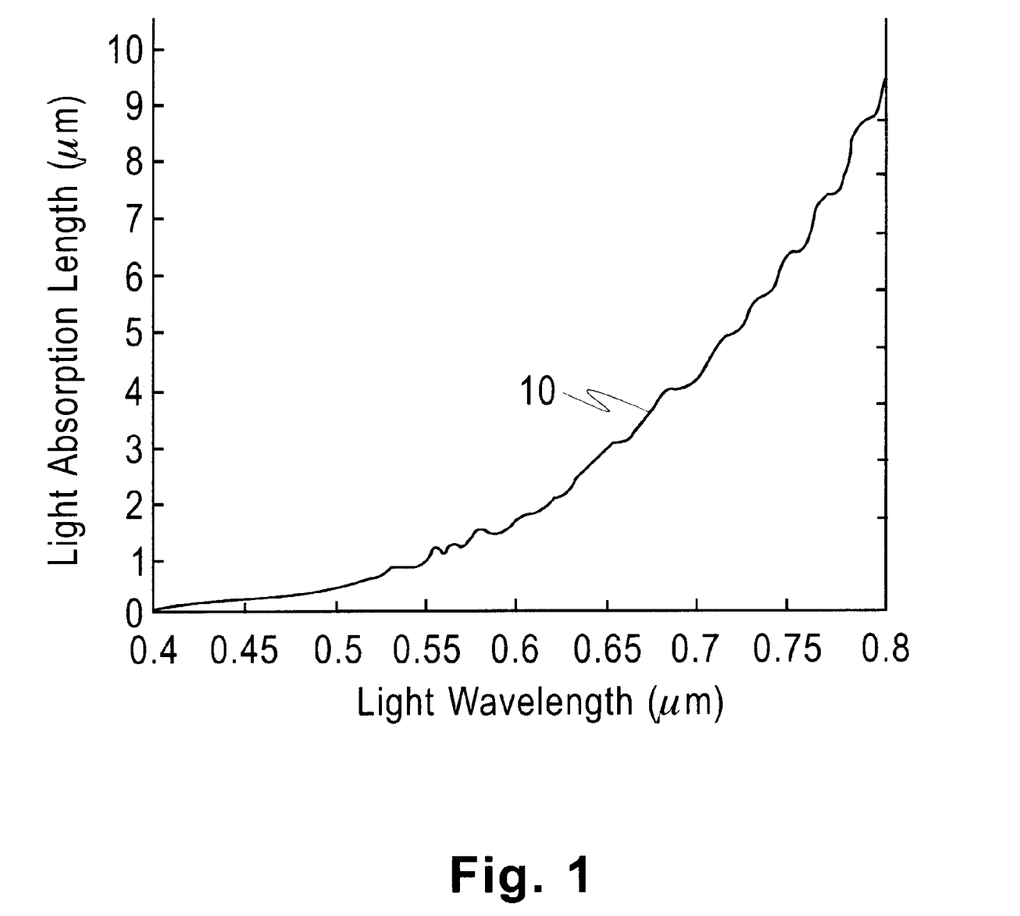
FIG. 1 is a graph of light absorption length in silicon versus wavelength.

FIG. 1 shows a graph of the absorption length in silicon versus wavelength ($\mu$m). In FIG. 1, the ordinate represents light absorption length in silicon and the abscissa represents the light wavelength ($\mu$m). Curve 10 in FIG. 1 shows that light in the visible range has a long absorption length, such that the photon-to-electron conversion efficiency of imaging devices using an SOI substrate would be severely reduced compared to devices using a bulk substrate due to the thickness of the silicon layer on the insulator for the absorption of radiant energy.

Figure 2:
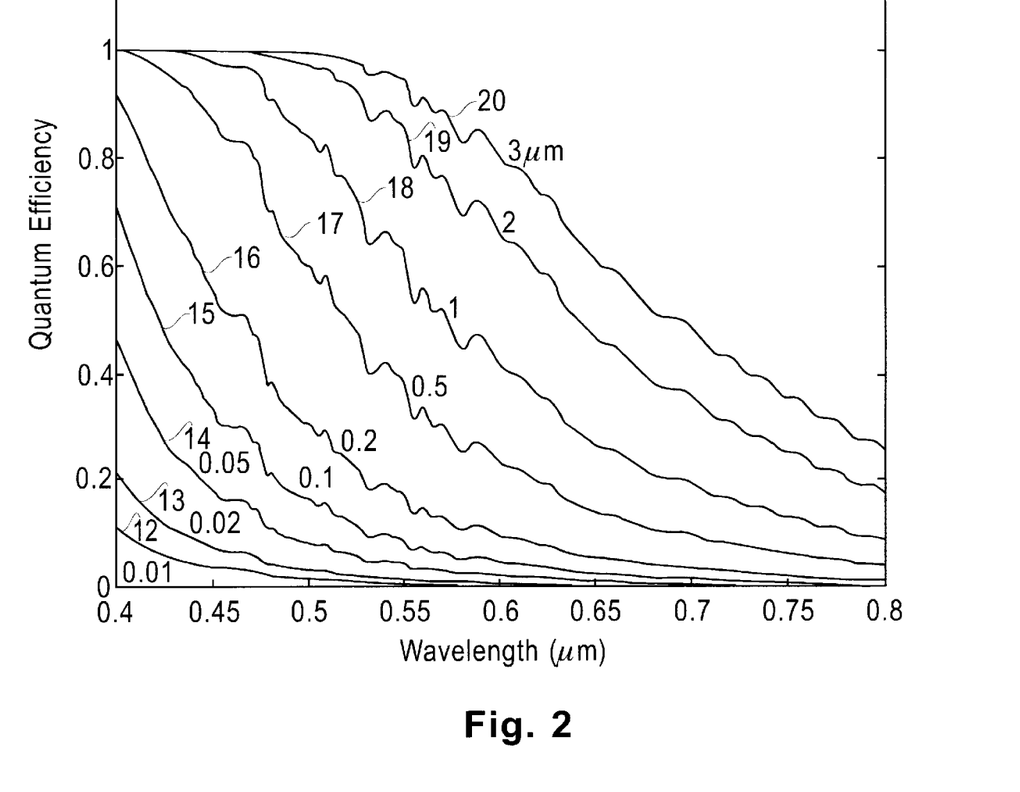
FIG. 2 is a graph of the quantum efficiency of photodiodes at various SOI thicknesses versus wavelength.

FIG. 2 is a graph of the quantum efficiency of photodiodes versus wavelength ($\mu$m) for a SOI layer of various thickness. In FIG. 2, the ordinate represents quantum efficiency of photodiodes and the abscissa represents wavelength ($\mu$m) of radiant energy. Curves 12–20 show the quantum efficiency of photodiodes for SOI epitaxial thickness of 0.01, 0.02, 0.05, 0.1, 0.2, 0.5, 1.0, 2.0 and 3.0 microns, respectively. The quantum efficiency is determined by the maximum absorption/collection depth of a SOI imaging device and would be as shown in FIG. 2. The absorption/collection depth would be the thickness of the SOI which is typically 0.2 microns or less compared to typical collection depths in bulk silicon of several microns. For imaging devices based on SOI substrates to have significant quantum efficiencies, it is necessary to provide internal gain for the photon-to-electron conversion in view of the low anticipated quantum efficiency.

Some structures have been described for obtaining bipolar gain such as a SOI MOSFET with a floating body, see for example, the publications by S. Verdonckt-Vandebroek et al., "High-gain lateral pnp bipolar action in a p-MOSFET structure," IEEE Electron Device Letters, Vol. 13, p. 312, 1992 and S. Verdonckt-Vandebroek, et al. "High-gain lateral bipolar action in a MOSFET structure," IEEE Trans. on Electron Devices, Vol. 38, p. 2487, 1991.

SUMMARY OF THE INVENTION

In accordance with the present invention, a method and apparatus for detecting an image is described comprising an array of detector cells for sensing radiant energy, an insulating substrate, a plurality of islands of single crystal semiconductor material over the substrate, at least one of the detector cells having a first, second, and third region adjacent one another formed in one of the islands, the second region positioned between the first and third regions wherein the first and third regions are doped to form a first type of semiconductor material and the second region is doped to form a second type, a layer of insulation over the second region between the first and third regions to form a gate dielectric, and a gate electrode formed over the layer of insulation over the second region between the first and third regions for collecting or holding charge in the second region or body during first times, the second region positioned for receiving radiant energy to generate charge in the second region, the first region, the second region between the first and third regions and the third region functioning as a lateral bipolar transistor at second times in response to a control signal wherein the charge in the second region acting as a base of a bipolar transistor flows to the first region acting as an emitter to provide current gain at the third region acting as a collector.

The invention further describes an array of detector cells that may be formed on bulk silicon or other semiconductor material where the body of an FET is isolated to allow the body to float as a function of the charge accumulated.

The invention further describes an array of detector cells as above in SOI or bulk silicon except at second times no control signal is needed and the collected charge at second times flows into the first region due to forward biasing of the pn junction formed at the interface of the first and second region.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 3:
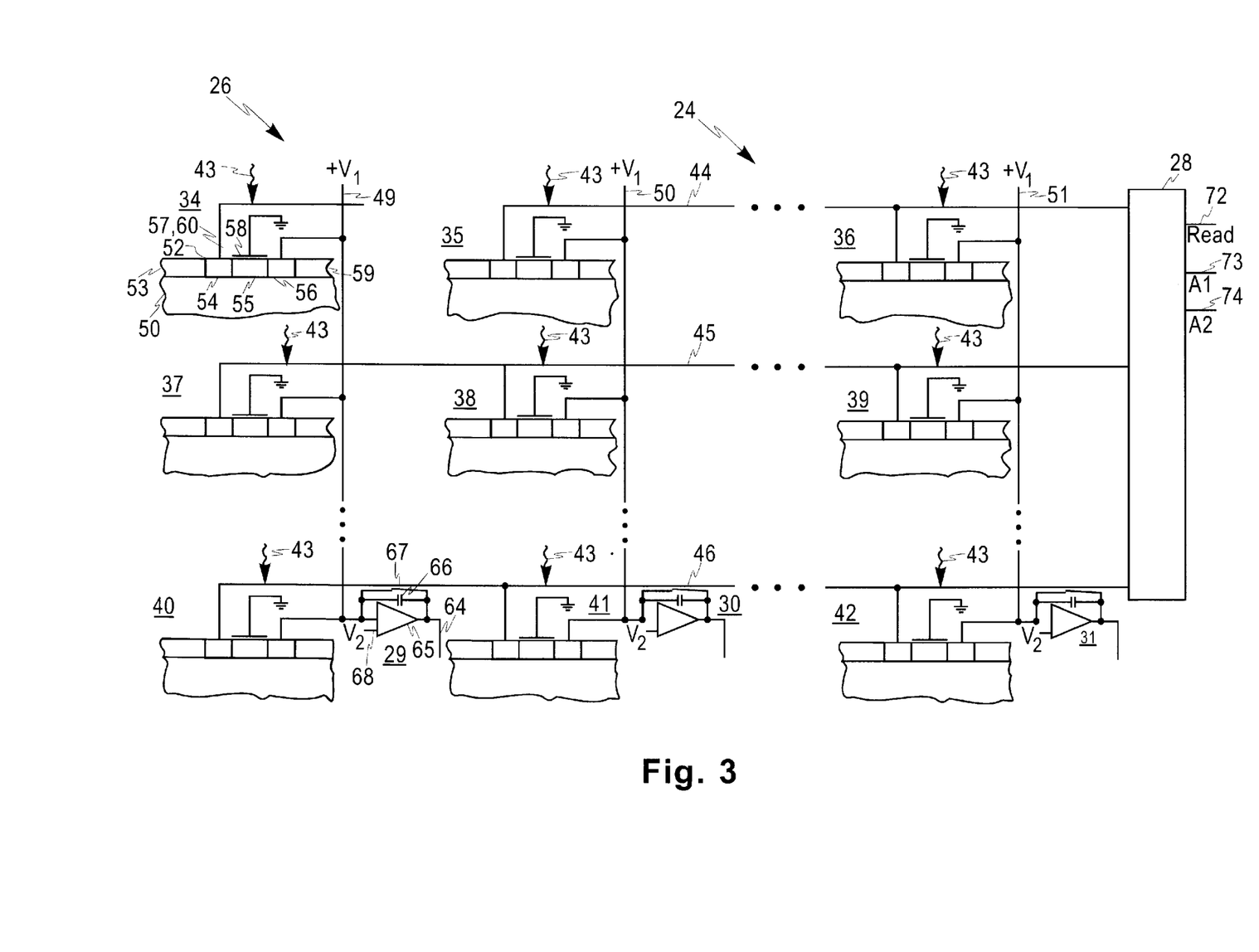
FIG. 3 shows a first embodiment of the invention.

Referring to FIG. 3, an image sensor 24 is shown comprising an array of detector cells 26, row decoder 28 and output amplifiers 29–31. Image sensor 24 functions to sense radiant energy at a plurality of detector cells 34–42 to provide respective signals corresponding to the incident radiant energy 43 to form an image. Array of detector cells 26 are arranged in columns and rows. Detector cells 34–36 are in row 1 and are coupled over lead 44 to a first output of row decoder 28. Detector cells 37–39 are in row 2 and are coupled over lead 45 to a second output of row decoder 28.

Detector cells 40–42 are in row 3 and are coupled over lead 46 to a third output of row decoder 28.

Detector cells 34, 37, and 40 are in column 1 and are coupled over lead 49 to an input of amplifier 29. Detector cells 35, 38 and 41 are in column 2 and are coupled over lead 50 to an input of amplifier 30. Detector cells 36, 39 and 42 are in column 3 and are coupled over lead 51 to an input of amplifier 31. The number of rows and columns in array of detector cells 26 may be increased indefinitely such as to an array of 1024 rows and 1024 columns.

Figure 6:
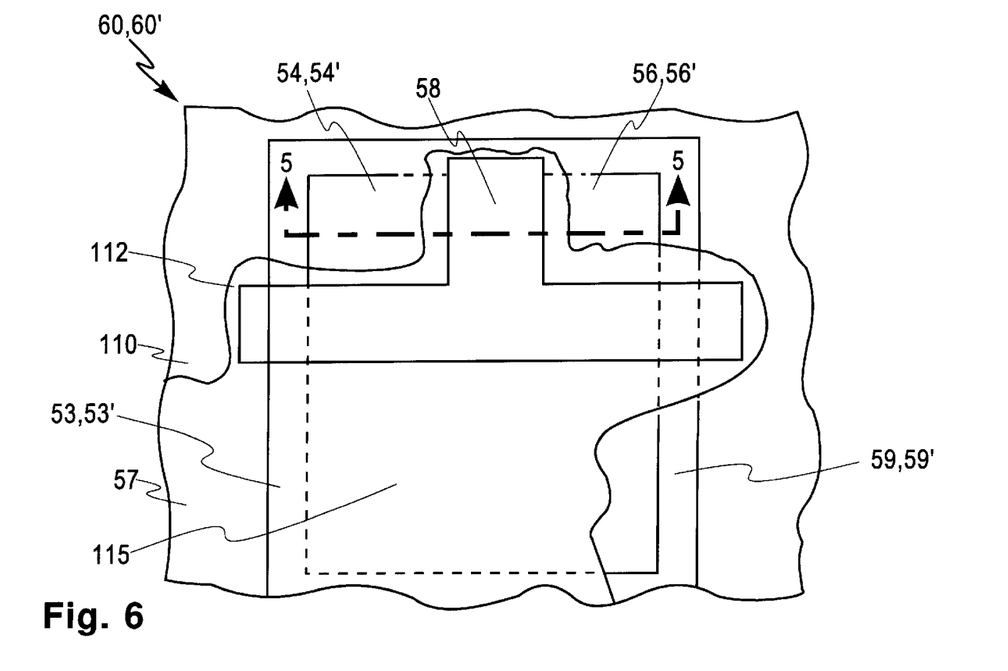
FIG. 6 shows a top view of a MOSFET used as an amplifying photodector.

Detector cells 34–42 may be formed on an insulating substrate 50 having a plurality of semiconductor islands 52 formed from a semiconductor layer. The semiconductor layer may be from a silicon-on-insulator (SOI) substrate where the silicon layer is single crystal. Each detector cell 34–42 is formed on a respective semiconductor island 52 and includes a metal oxide semiconductor field effect transistor (MOSFET) 60 comprising first region 54, second region 55 and third region 56 adjacent one another with second region 55 having portions positioned between first region 54 and third region 56. A top view of MOSFET 60 is shown in FIG. 6. Second region 55 may have other portions positioned for receiving radiant energy as shown in FIG. 6. First region 54 and third region 56 are doped to form a first type semiconductor material and second region 55 is doped to form a second type. Regions 54 and 56 may be n+ type and self aligned with respect to the edge of gate electrode 58. Second region 55 may be p type. Second region 55 may be n type if first and second regions are p type. A layer of insulation may be formed over second region 55 to form a gate dielectric 57. A gate electrode 58 may be formed over second region 55 for holding charge in second region 55 during first times T1 when radiant energy 43 is being sensed. Gate electrode 58 may be held at a potential such as ground if MOSFET 60 is n type.

Region 54 during first times forms the source of MOSFET 60 which will be considered n type for this description and is held at +V potential via leads 44–46. Region 54 forms an emitter when MOSFET 60 is in the bipolar mode. Second region 55 forms a body and a base of a bipolar transistor when in the bipolar mode. Third region 56 forms a drain of MOSFET 60 and a collector when in ther bipolar mode. Body 55 is floating electrically. Regions 53 and 59 are adjacent transistor 60 and may be silicon oxide or other insulating material, to reduce capacitance to the source and drain, respectively of transistor 60 and to form island 52 to provide electrical isolation from other devices.

Gate electrode 58 may be selected to be transmissive to radiant energy 43 over a desired range of wavelengths such as 300 nm to 850 nm to permit radiant energy to enter into second region 55 which may have a large area not covered by gate electrode 58 to receive a maximum amount of radiant energy 43. Third region 56 functions as a drain/collector and is held at +V potential via leads 49–51 coupled to or precharged to +V potential. During times T1, leads 49–51 are coupled to the drain/collector 56 of MOSFET's 60 in respective columns of array of detector cells 26. Leads 49–51 must be maintained at a constant voltage and also be able to readout charge dumped onto the respective column line or lead during readout from drain/collector 56 of MOSFET's 60. A variety of circuits can be used to implement this function. An example of such a circuit are charge integrators 29–31 coupled to respective leads 49–51 shown in FIG. 3.

Amplifiers 29–31 comprise an operational amplifier 65 having a first input coupled over lead 49 to third region 56 of MOSFET 60, to one side of capacitor 66 and to one side of resetting switch 67. The other side of capacitor 66 and resetting switch 67 is coupled over lead 64 to the output of operational amplifier 65. Lead 64 provides the output signal from amplifier 29. A second input to operational amplifier 65 is coupled over lead 68 to $V_2$ potential. Like reference numbers are used for operational amplifiers 30–31 for components corresponding to operational amplifier 29. Another example of an amplifier circuit suitable for reading out charge on a column lead is described in U.S. patent Ser. No. 08/600706 filed Feb. 13, 1996 by Hon-Sum Philip Wong, the co-inventor herein, now U.S. Pat. No. 5,708,263 which issued Jan. 13, 1998, which is assigned to the assignee herein and incorporated herein by reference.

Row decoder 28 has a control signal READ coupled over lead 72 and a plurality of address signals A1–A2 coupled over respective leads 73–74. Row decoder 28 functions to select a row of detector cells via selecting one of leads 44–46 in response to address signals A1–A2 and control signal READ. The source of MOSFET 60 is held at +V during radiant energy sensing or integration (image sensing), and goes to ground potential when selected by row decoder 28 during readout. During readout, MOSFET 60 forms a lateral pnp or npn bipolar transistor where the charge in body/base 55 is amplified by the β of the lateral bipolar transistor.

During radiant energy sensing or integration, photons enter the body/base 55 of MOSFET 60, generating electron/hole pairs. For the case where MOSFET 60 is n type, electrons flow into n type source 54 and drain 56 via leads 44 and 49, respectively. Holes are collected and held within p type body 55, thereby raising the body potential or voltage as holes are collected. The charge due to holes may be stored largely in the capacitance between the gate electrode 58 and the body 55 and may be accumulated at the silicon surface under the gate due to the biased conditions described. The source-body and drain-body junctions are kept reverse biased during radiant energy sensing or integration. During read out, time $T_{read}$, source 54 is pulsed to a low potential while the drain potential stays at a voltage +V. The source-body junction attains a forward bias due to the holes collected in body 55, causing these holes to flow out of body 55 to source 54. This hole current is amplified by the bipolar gain of the lateral npn bipolar transistor, bipolar/MOSFET 60. The collector current is drawn from the column line e.g. lead 49, and the charge flowing out of lead 49 equals the number of holes accumulated in body 55 multiplied by the bipolar gain of bipolar/MOSFET 60.

Because the un-selected rows are not explicitly isolated from the sensing node i.e. column lead 49, the effect of the photocurrent from the un-selected cells on the sensing node must be considered. The photocurrent from un-selected cells is due to the flow of electrons generated in body 55 flowing into drain 56 in each of the un-selected cells during each readout period. Let $C_{Full}$ equal the full well charge or full body charge of body 55, $T_{int}$ equal the radiant energy integration time, $T_{read}$ equal the read out time of the accessed row, N equal the number of rows of detectors, n equal the number of bits of resolution of the sensed signal, β equal the bipolar gain of photo-sensitive MOSFET 60. Then the maximum amount of charge dumped by un-selected detector cells via region 56 of MOSFET 60 onto the sensing node during the readout time $T_{read}$ is $N \times C_{Full} \times T_{read}/T_{int}$, and the minimum charge dumped to the sensing node by the accessed cell is $\beta \times C_{Full}/2^n$. Therefore, the following requirement on the readout time must be met as shown in equations 1 and 2.

$$\beta \times C_{Full}/2^n >> N \times C_{Full} \times T_{read}/T_{int} \tag{1}$$

$$T_{read}/T_{int} << \beta/2^n \times N \quad (2)$$

Putting in typical values for the above parameters: β=100, n=8, N=1000, and $T_{int}$=33 ms, then $T_{read}$ must be much less than 13 μs. The above values appear reasonable and can be met without extra circuitry.

Image sensor 24 uses detector cells 34–42 with one MOSFET 60 per detector cell or pixel and requires no row selection switch within the pixel, resulting in the largest optical fill-factor possible since more semiconductor area is available for detecting radiant energy 43. MOSFET 60 may have threshold voltage variation in various detector cells, which does not result in fixed pattern noise from the array of detector cells 26. Photo-generated charge in body 55 of MOSFET 60 is multiplied by the bipolar gain of bipolar/MOSFET 60 operating as a lateral bipolar transistor. However, variations in the bipolar gain of MOSFET 60 in various detector cells may introduce fixed pattern noise upon readout from array of detector cells 26.

Figure 4A:
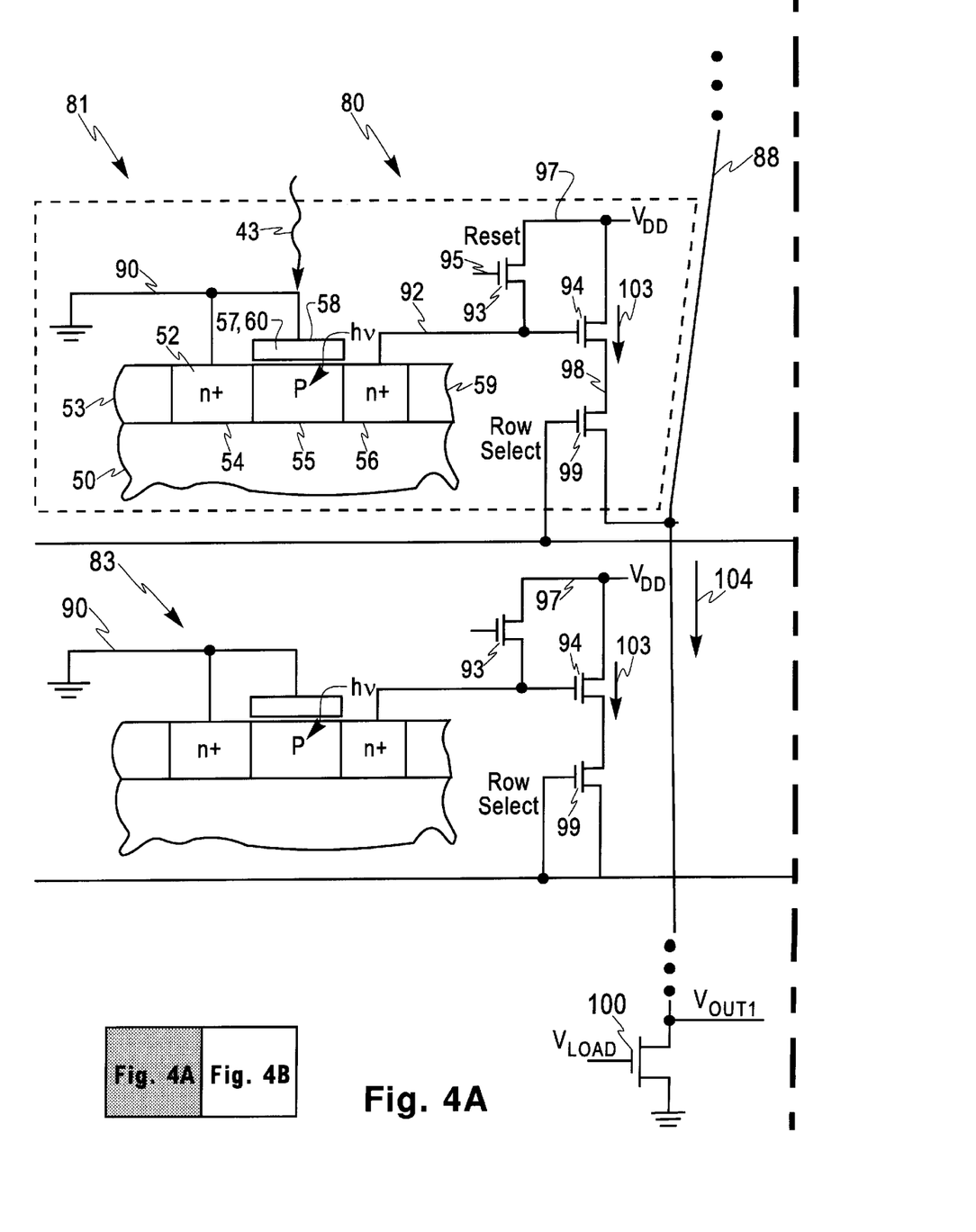
FIG. 4 shows a second embodiment of the invention.
Figure 4B:
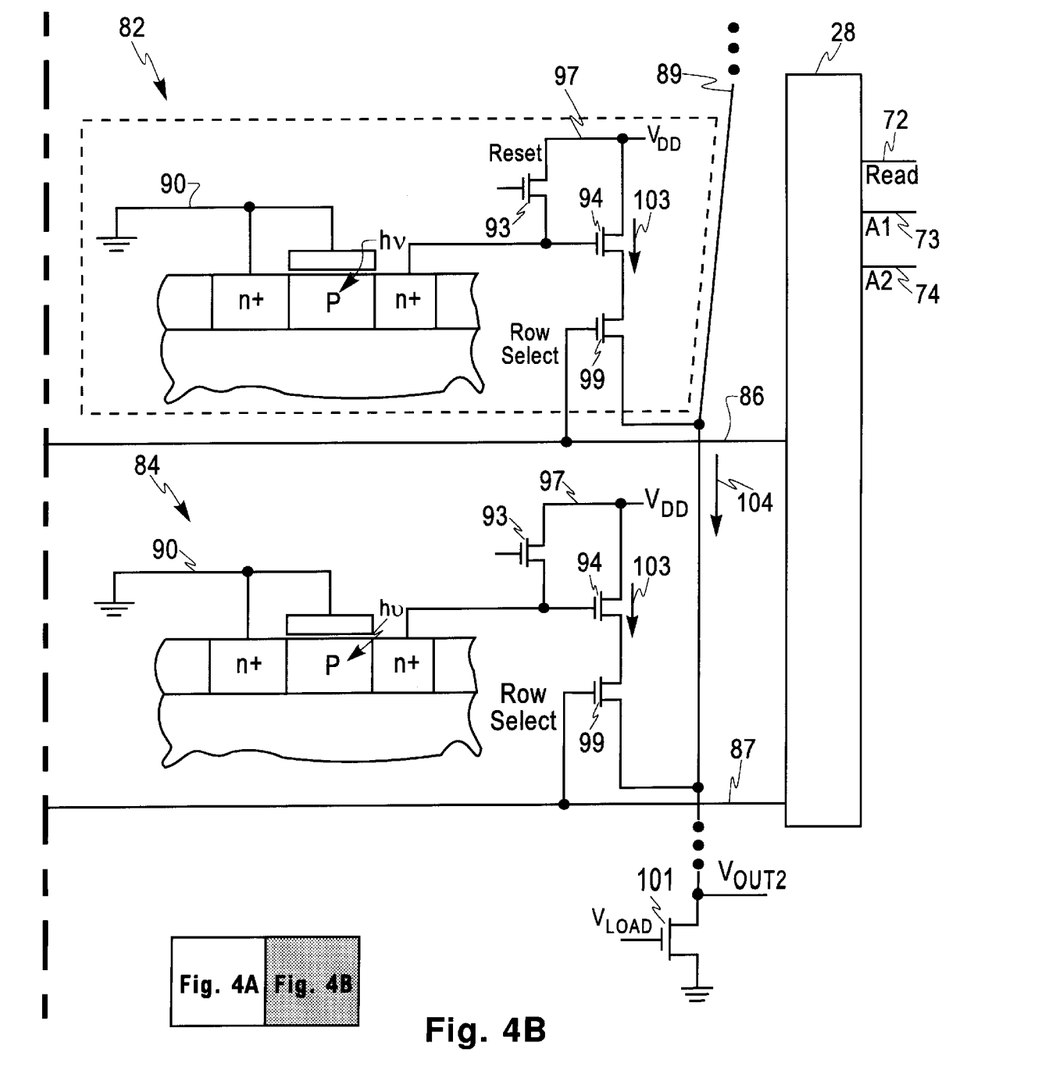

FIG. 4 shows image sensor 80 comprising a plurality of detector cells 81–84 arranged in rows and columns. In FIG. 4, like references are used for functions corresponding to the apparatus of FIG. 3. Row decoder 28 functions to select one of row leads 86 and 87. Row lead 86 is coupled to detector cells 81 and 82 and row lead 87 is coupled to detector cells 83 and 84. Column lead 88 is coupled to detector cells 81 and 83 and column lead 89 is coupled to detector cells 82 and 84.

Each detector cell 81-84 has a source 54, a body 55, a drain 56, and gate electrode 58 forming n type MOSFET 60. Source 54 is coupled over lead 90 to gate electrode 58 and to ground potential. Drain 56 is coupled over lead 92 to the source of n type transistor 93 and the gate electrode of transistor 94. The gate of transistor 93 is coupled over lead 95 to control signal RESET which functions to reset the voltage on drain 56 to a positive potential. The drain of transistor 93 and the drain of n type transistor 94 are coupled over lead 97 to a positive voltage supply $V_{DD}$. The source of transistor 94 is coupled over lead 98 to the drain of transistor 99. For detector cells 81 and 82, the gate electrode of transistor 99 is coupled over lead 86 to row decoder 28. For detector cells 83 and 84, the gate electrode of transistor 99 is coupled over lead 87 to row decoder 28. For detector cells 81 and 83, the source of transistor 99 is coupled over lead 88 to the drain of transistor 100 and to an output terminal $V_{out1}$. For detector cells 82 and 84, the source of transistor 99 is coupled over lead 89 to the drain of transistor 101 and to output terminal $V_{out2}$. The gate electrode of transistors 100 and 101 are coupled to voltage potential $V_{LOAD}$ which is adjusted to cause transistors 100 and 101 to draw current as shown by arrows 103–104. The source of transistors 100 and 101 are coupled to ground potential.

Transistor 93 functions as a reset switch. Transistor 99 functions as a row select switch. Transistor 94 functions as a input transistor for a source follower circuit. Transistors 100 and 101 function as load transistors for the source follower circuit and are common to the entire column of detector cells. Other circuits that perform resetting and row selection can be used; an example is the circuit disclosed by J. Nocera et al., "A pixel selection scheme for MOS imager," IBM Technical Disclosure Bulletin, Vol. 38, n12, 12–1995 p 225–258.

In operation of image sensor 80, control signal RESET turns on transistor 93 briefly after each readout, resetting the drain 56 of MOSFET 60 to a positive potential reset level. During radiant energy integration, photons enter the floating body 55 and are absorbed in body 55 generating electron/hole pairs. Photo generated electrons flow out towards drain 56, discharging the floating drain node and lead 92. Photo generated holes are temporarily stored in floating body 55. When floating body 55 collects holes, the source 54 and body 55 junction is forward biased and the hole current which flows into source 54 is multiplied by the bipolar gain beta of the lateral bipolar/MOSFET 60. This amplified hole current further discharges the floating drain 56 and lead 92. Thus, the photo generated carriers are amplified and discharge lead 92. During readout, a source follower circuit comprising transistor 94, transistor 99 acting as a switch and transistor 100 acting as a load provide an output voltage $V_{out1}$ on lead 88.

Figure 5:
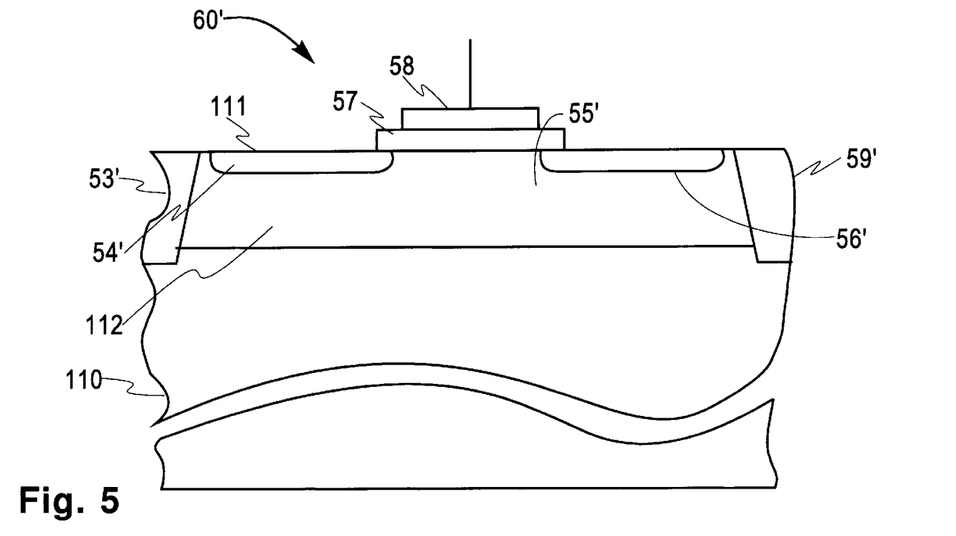
FIG. 5 shows a cross section view along the line 5—5 of FIG. 6 of an embodiment formed in bulk silicon.

FIG. 5 shows a cross section view of MOSFET 60' along the line 5—5 of FIG. 6. FIG. 6 shows a top view of MOSFET 60 or 60'. MOSFET 60' is made on bulk silicon as opposed to MOSFET 60 which is made on SOI. Referring to FIG. 3, detector cells 34–42 built with MOSFET's 60 may be replaced with detector cells 34'–42' built with MOSFET's 60'. Likewise, referring to FIG. 4, detector cells 81–84 built with MOSFET's 60 may be replaced with detector cells 81'–84' built with MOSFET's 60'. MOSFET 60' may have a bulk silicon substrate 110 of n type which may be common to all detector cells. Substrate 110 may be a buried layer connected to a positive potential. A p well 112 may be formed in upper surface 111 of substrate 110. A first region 54' of n+ type may be formed in p well 112. A third region 56' of n+ type may be formed in p well 112 and spaced apart from first region 54' with a second region 55' doped p type therebetween such as from p well 112 for forming the channel of MOSFET 60'. A gate dielectric 57 may be formed on upper surface 111. A gate electrode 58 which may be metal or polysilicon may be formed on gate dielectric 57 over second region 55'. Second region 55' is floating electrically. In MOSFET 60', p and n type regions may be reversed to form a p type MOSFET.

First region 54' and third region 56' may be formed by ion implantation using gate electrode 58 and a mask (not shown) covering p well 112 beyond regions 54' and 56' and in region 115 on the other side of gate electrode 58. Region 115 will provide a larger sensing area for radiant energy 43. Electron-hole pairs in region 115 will be generated from radiant energy 43 without passing through electrode gate 58. Either the electrons or the holes of the electron-hole pairs will be attracted to the region below gate electrode 58 and sensed during read out as described with respect to FIGS. 3 and 4.

Regions 53' and 59' adjacent transistor 60' may be silicon oxide or other insulating material to reduce capacitance to the source and drain, respectively and to provide electrical isolation from other devices. Regions 53, 53', 59 and 59' may be formed by thermal oxide or by filling shallow trenches with an insulator. Regions 53, 53', 59 and 59' may extend around the periphery of transistor 60 or 60' with region 53 connecting to region 59 or region 53' connecting to region 59'. Transistor 60 shown in FIGS. 3 and 4 may be formed on a SOI substrate 50 with silicon oxide or an insulator layer below transistor 60 in place of the bulk silicon substrate 110.

If p type transistors are substituted for n type transistors, then appropriate voltage and potential changes would be made in the embodiments of FIGS. 3 and 4.

In FIGS. 4–6, like references are used for functions corresponding to the apparatus of an earlier Figure.

While there has been described and illustrated a image sensor for sensing radiant energy comprising a plurality of detector cells with one MOSFET per detector cell operating as a lateral bipolar transistor during readout to obtain current gain, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. An apparatus for detecting an image comprising:
    an array of detector cells for sensing radiant energy,
    an insulating substrate,
    a plurality of islands of single crystal semiconductor material over said substrate,
    at least one of said detector cells having a first, second, and third region adjacent one another formed in one of said islands, said second region positioned between said first and third regions wherein said first and third regions are doped to form a first type semiconductor material and said second region is doped to form a second type semiconductor material,
    a layer of insulation over said second region between said first and third regions to form a gate dielectric, and
    a gate electrode formed over said layer of insulation over said second region for holding charge in said second region during first times when radiant energy is being sensed, said second region positioned for receiving radiant energy to generate said charge in said second region,
    said first, second and third regions functioning as a lateral bipolar transistor at second times during readout in response to a control signal wherein said charge in said second region acting as a base of a bipolar transistor when in a bipolar mode flows to said first region acting as an emitter to provide current gain at said third region acting as a collector.

2. The apparatus of claim 1 wherein said gate electrode is transmissive to radiant energy.

3. The apparatus of claim 1 wherein said first type is n and said second type is p.

4. The apparatus of claim 3 wherein said detector cells are arranged in rows and columns and further including circuitry for selecting one of said rows in response to address signals and a control signal for lowering the potential of the first region of respective detector cells in said row.

5. The apparatus of claim 4 further including a column lead coupled to said third region of said detector cells in a column.

6. The apparatus of claim 5 further including an amplifier coupled to said column lead for providing an output voltage indicative of the radiant energy sensed.

7. The apparatus of claim 1 wherein said detector cells are arranged in rows and columns and further including first circuitry for resetting the voltage of said third region of each detector cell.

8. The apparatus of claim 7 further including second circuitry for selecting one of said rows in response to address signals and a control signal for reading out a voltage indicative of the voltage on said third region.

9. An apparatus for detecting an image comprising:
    an array of detector cells for sensing radiant energy,
    a semiconductor layer of a first conductivity type,
    a plurality of wells of a second type formed in said semiconductor layer,
    at least one of said detector cells having a first, second, and third region adjacent one another formed in one of said wells, said second region positioned between said first and third regions wherein said first and third regions are doped to form a first type semiconductor material and said second region is doped to form a second type semiconductor material,
    a layer of insulation over said second region between said first and third regions to form a gate dielectric, and
    a gate electrode formed over said layer of insulation over said second region for holding charge in said second region during first times when radiant energy is being sensed, said second region positioned for receiving radiant energy to generate said charge in said second region,
    said first, second and third regions functioning as a lateral bipolar transistor at second times during readout in response to a control signal wherein said charge in said second region acting as a base of a bipolar transistor when in a bipolar mode flows to said first region acting as an emitter to provide current gain at said third region acting as a collector.

10. The apparatus of claim 9 wherein said gate electrode is transmissive to radiant energy.

11. The apparatus of claim 9 wherein said first type is n and said second type is p.

12. The apparatus of claim 9 wherein said detector cells are arranged in rows and columns and further including circuitry for selecting one of said rows in response to address signals and a control signal for lowering the potential of the first region of respective detector cells in said row.

13. The apparatus of claim 12 further including a column lead coupled to said third region of said detector cells in a column.

14. The apparatus of claim 13 further including an amplifier coupled to said column lead for providing an output voltage indicative of the radiant energy sensed.

15. The apparatus of claim 9 wherein said detector cells are arranged in rows and columns and further including first circuitry for resetting the voltage of said third region of each detector cell.

16. The apparatus of claim 15 further including second circuitry for selecting one of said rows in response to address signals and a control signal for reading out a voltage indicative of the voltage on said third region.

17. An apparatus for detecting an image comprising:
    an array of detector cells for sensing radiant energy,
    an insulating substrate,
    a plurality of islands of single crystal semiconductor material over said substrate,
    at least one of said detector cells having a first, second, and third region adjacent one another formed in one of said islands, said second region positioned between said first and third regions wherein said first and third regions are doped to form a first type semiconductor material and said second region is doped to form a second type semiconductor material,
    a layer of insulation over said second region between said first and third regions to form a gate dielectric, and
    a gate electrode formed over said layer of insulation over said second region for holding charge in said second region during first times when radiant energy is being sensed, said second region positioned for receiving radiant energy to generate said charge in said second region,
    said first, second and third regions functioning as a lateral bipolar transistor at second times during readout wherein said charge in said second region acting as a base of a bipolar transistor when in a bipolar mode flows to said first region acting as an emitter to provide current gain at said third region acting as a collector.

18. The apparatus of claim 17 wherein said gate electrode is transmissive to radiant energy.

19. The apparatus of claim 17 wherein said first type is n and said second type is p.

20. The apparatus of claim 17 wherein said detector cells are arranged in rows and columns and further including circuitry for selecting one of said rows in response to address signals for reading out signals indicative of the radiant energy sensed.

21. The apparatus of claim 20 further including a column lead coupled to said third region of said detector cells in a column.

22. The apparatus of claim 21 further including a source follower circuit coupled between said third region and said column lead for providing an output signal indicative of the radiant energy sensed.

23. The apparatus of claim 17 wherein said detector cells are arranged in rows and columns and further including first circuitry for resetting the voltage of said third region of each detector cell.

24. The apparatus of claim 23 wherein said first circuitry includes a switch coupled to a potential.

25. The apparatus of claim 23 further including second circuitry for selecting one of said rows in response to address signals and for providing an output signal indicative of the radiant energy sensed.

26. The apparatus of claim 17 wherein said gate electrode and said first region are coupled together to a potential.

27. An apparatus for detecting an image comprising:

an array of detector cells for sensing radiant energy, a semiconductor substrate of a first conductivity type, a plurality of wells of a second type formed in said semiconductor substrate, at least one of said detector cells having a first, second, and third region adjacent one another formed in one of said wells, said second region positioned between said first and third regions wherein said first and third regions are doped to form a first type semiconductor material and said second region is doped to form a second type semiconductor material, a layer of insulation over said second region between said first and third regions to form a gate dielectric, and a gate electrode formed over said layer of insulation over said second region for accumulating charge in said second region during first times when radiant energy is being sensed, said second region positioned for receiving radiant energy to generate said charge in said second region, said first, second and third regions functioning as a lateral bipolar transistor at second times during readout wherein said charge in said second region acting as a base of a bipolar transistor when in a bipolar mode flows to said first region acting as an emitter to provide current gain at said third region acting as a collector.

28. The apparatus of claim 27 wherein said first type is n and said second type is p.

29. The apparatus of claim 27 wherein said detector cells are arranged in rows and columns and further including circuitry for selecting one of said rows in response to address signals for reading out signals indicative of the radiant energy sensed.

30. The apparatus of claim 29 further including a column lead coupled to said third region of said detector cells in a column.

31. The apparatus of claim 30 further including a source follower circuit coupled between said third region and said column lead for providing an output signal indicative of the radiant energy sensed.

32. The apparatus of claim 27 wherein said detector cells are arranged in rows and columns and further including first circuitry for resetting the voltage of said third region of each detector cell.

33. The apparatus of claim 32 wherein said first circuitry includes a switch coupled to a potential.

34. The apparatus of claim 32 further including second circuitry for selecting one of said rows in response to address signals and for providing an output signal indicative of the radiant energy sensed.

35. The apparatus of claim 27 wherein said gate electrode and said first region are coupled together to a potential.

36. The apparatus of claim 27 wherein said gate electrode is transmissive to radiant energy.

* * * * *